(12) United States Patent
Iwasaki

(10) Patent No.: US 7,453,087 B2
(45) Date of Patent: Nov. 18, 2008

(54) THIN-FILM TRANSISTOR AND THIN-FILM DIODE HAVING AMORPHOUS-OXIDE SEMICONDUCTOR LAYER

(75) Inventor: Tatsuya Iwasaki, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 323 days.

(21) Appl. No.: 11/514,190

(22) Filed: Sep. 1, 2006

(65) Prior Publication Data

US 2007/0063211 A1 Mar. 22, 2007

(30) Foreign Application Priority Data

Sep. 6, 2005 (JP) ............................. 2005-258272

(51) Int. Cl.
*H01L 29/04* (2006.01)

(52) U.S. Cl. ................. 257/59; 257/292; 257/E29.151; 257/E51.005; 438/149

(58) Field of Classification Search ................... 257/59, 257/72, 291, 292, 443, E29.151, E51.005; 438/149
See application file for complete search history.

(56) References Cited

U.S. PATENT DOCUMENTS

| | | | |
|---|---|---|---|
| 6,274,885 B1 * | 8/2001 | Yamazaki et al. | 257/59 |
| 6,476,409 B2 | 11/2002 | Iwasaki et al. | 257/13 |
| 6,784,007 B2 | 8/2004 | Iwasaki et al. | 438/22 |
| 2006/0138394 A1 | 6/2006 | Den et al. | 257/3 |

OTHER PUBLICATIONS

Kenji Nomura, et al., "Room-temperature fabrication of transparent flexible thin-film transistors using amorphous oxide semiconductors", Nature, vol. 432, Nov. 25, 2004, pp. 488-492.

* cited by examiner

*Primary Examiner*—Quoc D Hoang
(74) *Attorney, Agent, or Firm*—Fitzpatrick, Cella, Harper & Scinto

(57) ABSTRACT

A thin-film transistor including a channel layer being formed of an oxide semiconductor transparent to visible light and having a refractive index of nx, a gate-insulating layer disposed on one face of the channel layer, and a transparent layer disposed on the other face of the channel layer and having a refractive index of nt, where there is a relationship of nx>nt. A thin-film transistor including a substrate having a refractive index of no, a transparent layer disposed on the substrate and having a refractive index of nt, and a channel layer disposed on the transparent layer and having a refractive index of nx, where there is a relationship of nx>nt>no.

15 Claims, 7 Drawing Sheets

THIN-FILM TRANSISTOR AND THIN-FILM DIODE HAVING AMORPHOUS-OXIDE SEMICONDUCTOR LAYER

BACKGROUND OF THE INVENTION

1. Field of the Invention

The present invention relates to transparent semiconductor devices. Specifically, the present invention relates to field-effect thin-film transistors and thin-film diodes having amorphous-oxide semiconductor-layers.

2. Description of the Related Art

Field-effect transistors (FETs) are three-terminal devices each having a gate electrode, a source electrode, and a drain electrode. An FET is an electronically active device for switching a current between the source electrode and the drain electrode by applying a voltage to the gate electrode to control the current flowing in a channel layer. In particular, an FET having a channel layer of a thin film disposed on an insulating substrate of ceramics, glass, or plastic is called a thin-film transistor (TFT).

TFTs are fabricated by using thin-film technology and advantageously can be readily formed on a substrate having a relatively large area. Therefore, TFTs are widely used as driving devices for flat-panel displays such as liquid-crystal displays. In other words, the ON/OFF of each image pixel of an active liquid-crystal display (ALCD) is controlled by a TFT fabricated on a glass substrate. Further, TFTs will be effective for driving pixel currents of future high-performance organic light-emitting diode (OLED) displays. In addition, a TFT circuit capable of driving/controlling an entire image has been fabricated on a substrate at the periphery of an image display region to allow a liquid-crystal display to achieve higher performance.

At present, metal-insulator-semiconductor field-effect transistors (MIS-FETs) are broadly used as TFTs. In MIS-FET devices, polycrystalline silicon films or amorphous silicon films are used as a channel layer. Practically, amorphous-silicon TFTs are used for driving pixels, and high-performance polycrystalline-silicon TFTs are used for driving/controlling entire images.

However, existing TFTs, such as amorphous-silicon TFTs and polycrystalline-silicon TFTs, are opaque to visible-range light.

Recently, use of an oxide for a channel layer of a transistor transparent to visible-range light has been considered.

For example, TFTs having a channel layer formed of a conductive and transparent thin film of polycrystalline oxide containing ZnO as the main component have been actively developed. The above-mentioned thin film can be formed at a relatively low temperature on a substrate such as a plastic sheet or film. However, materials containing ZnO as the main component cannot form a stable amorphous phase at room temperature. Consequently the materials form a polycrystalline phase. Therefore, the electron mobility of the resulting thin film cannot be increased due to the scattering at the interfaces of the polycrystalline particles. Additionally, the shapes of the polycrystalline particles and interconnection differ largely, depending on the methods of forming the film, resulting in unevenness in the characteristics of the TFT. Furthermore, the transparency may be decreased by the scattering of light at the interfaces of the polycrystalline particles.

Recently, a thin-film transistor using an amorphous oxide of an InGaZnO system has been reported (K. Nomura, et al., Nature, Vol. 432, 25 Nov. 2004, pp. 488-492).

FIG. 9 is a diagram showing the structure of this thin-film transistor.

A channel layer 31 of a-InGaZnO$_4$ is disposed on a glass substrate 30, and a gate-insulating layer 32 of Y$_2$O$_3$ is disposed on the channel layer 31. Reference numerals 33, 34, and 35 denote a source electrode, a drain electrode, and a gate electrode of indium-tin-oxide (ITO), respectively.

This transistor can be fabricated on a plastic or glass substrate at room temperature. The transistor has a field-effect mobility of about 6 to 9 and normally-OFF transistor characteristics. In addition, the transistor is transparent to visible light.

The thin-film transistor using the channel layer of the above-mentioned oxide has a transparency of about 80% to visible light. However, higher transparency is often desired, depending on the intended use. For example, when the transistor is disposed on a display surface, backplane, or glass of an automobile, higher transparency is preferred.

Furthermore, some thin-film transistors may appear to have color due to reflected light, depending on the constitution of the devices (e.g., thickness of each layer). In addition, designs of electronic devices may be restricted for retaining the transparency.

SUMMARY OF THE INVENTION

According to the present invention, an increase in the light transmittance of thin-film transistors or thin-film diodes having oxide semiconductor layers can be achieved.

In order to achieve the above-mentioned objective, a thin-film transistor in accordance with the present invention includes a channel layer, a gate-insulating layer disposed on one side of the channel layer, and a transparent layer disposed on the other side of the channel layer. The channel layer is formed of an oxide semiconductor transparent to visible light and has a refractive index of nx. The transparent layer has a refractive index of nt. Here, there is a relationship of nx>nt.

In addition, a thin-film transistor in accordance with the present invention includes a substrate, a channel layer disposed on the substrate, and a gate-insulating layer disposed on the channel layer. The substrate has a refractive index of no. The channel layer is formed of an amorphous oxide semiconductor transparent to visible light and has a refractive index of nx. The gate-insulating layer has a refractive index of ni. Here, the refractive index nx of the channel layer changes continuously or stepwise from no to ni in the film thickness direction.

Furthermore, a thin-film diode in accordance with the present invention includes a substrate, a transparent layer disposed on the substrate, and an oxide semiconductor layer disposed on the transparent layer. The substrate has a refractive index of no. The transparent layer has a refractive index of nt. The oxide semiconductor layer is transparent to visible light and has a refractive index of nx. Here, there is a relationship nx>nt>no.

According to the present invention, thin-film transistors having more excellent transparency can be achieved by arranging a transparent layer so as to be in contact with a channel layer and designing both the layers so as to have a certain relationship between the refractive indices thereof, or by regulating the refractive index of the channel layer. In addition, thin-film diodes having excellent transparency can be achieved by arranging a transparent layer so as to be in contact with a semiconductor layer and designing both the layers so as to have a certain relationship between the refractive indices thereof.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

The embodiments of the present invention will now be described with reference to the drawings.

Figure 1:
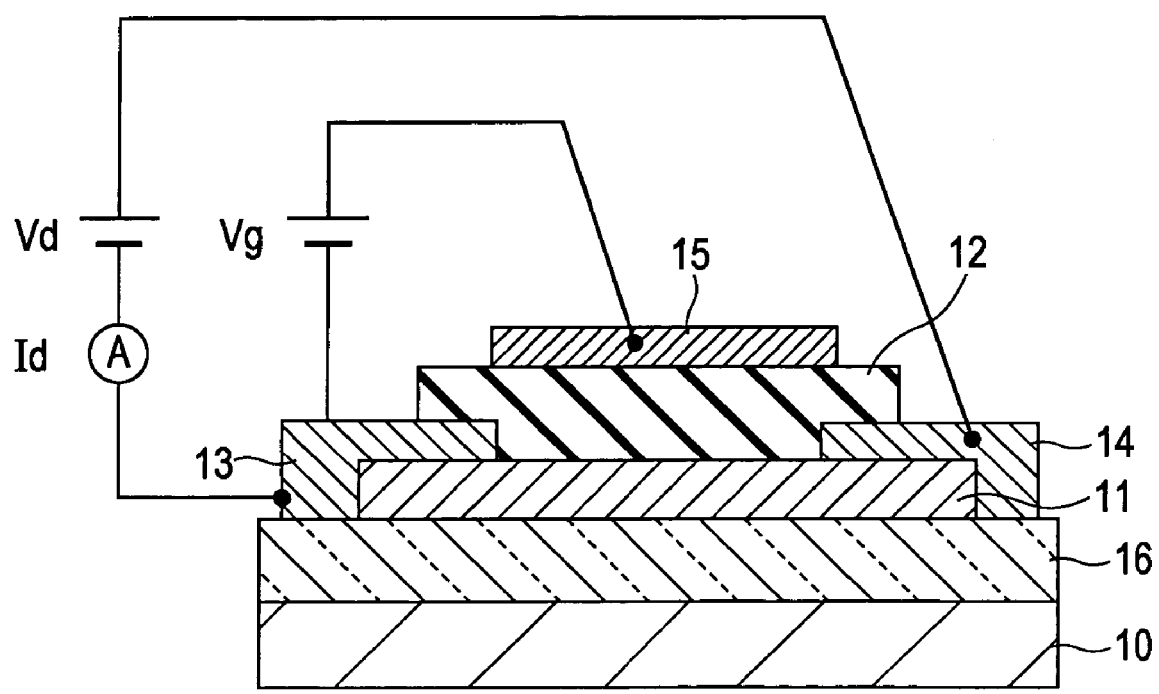
FIG. 1 is a cross-sectional view of a structure of a thin-film transistor according to the present invention.

FIG. 1 is a cross-sectional view of a structure of field-effect thin-film transistor according to the present invention.

In FIG. 1, a reference numeral 10 denotes a substrate of plastic (for example, PET) or glass, a reference numeral 11 denotes a channel layer, a reference numeral 12 denotes a gate-insulating layer, a reference numeral 13 denotes a source electrode, a reference numeral 14 denotes a drain electrode, a reference numeral 15 denotes a gate electrode, and a reference numeral 16 denotes a transparent layer.

In the thin-film transistor of the present invention, the transparent layer is disposed adjacent to the channel layer.

The thin-film transistor is a three-terminal device including a gate electrode 15, a source electrode 13, and a drain electrode 14. The thin-film transistor controls a current Id flowing in the channel layer by applying a voltage Vg to the gate electrode and thus is an electrically active device for switching the current Id between the source electrode and the drain electrode.

A transparent thin-film transistor can be fabricated by forming the channel layer 11, the gate-insulating layer 12, the electrodes 13, 14, and 15, the transparent layer 16, and the substrate 10 with transparent materials.

Figure 9:
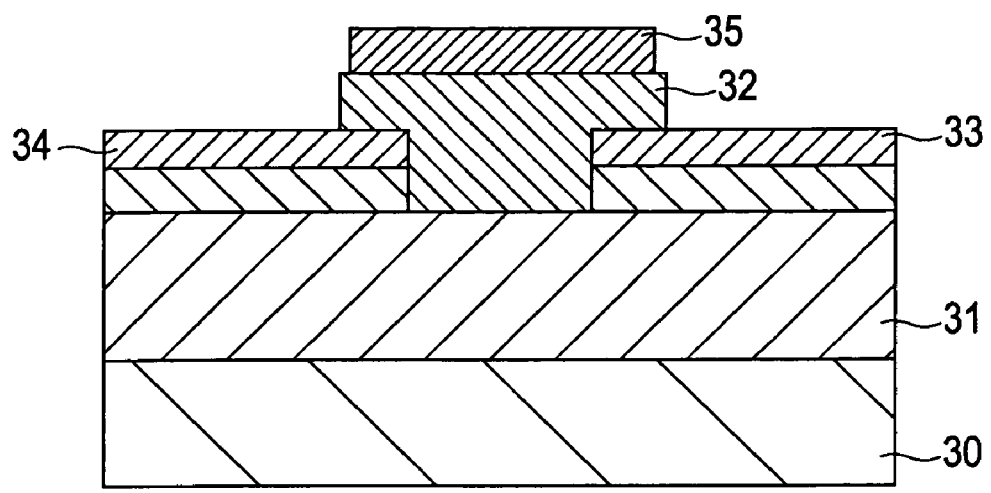
FIG. 9 is a cross-sectional view showing a structure of a known thin-film transistor.

In the structure of the thin-film transistor shown in FIG. 1, the transparent layer 16 is provided on the bottom of the channel layer 11 and thereby excellent transparency to visible light is achieved in the thin-film transistor compared to that in the above-mentioned known structure (FIG. 9).

In general, when light enters two media having different refractive indices, part of the incident light is always reflected at the interface of the media. In the present invention, the reflection of incident light from the back side (the lower side in the drawing) of the thin-film transistor can be decreased. In other words, the reflection of the incident light can be decreased by providing the transparent layer. Since the transparent layer 16 functions to prevent the reflection of light, a highly transparent thin-film transistor can be fabricated.

The transparent layer may be formed of any transparent material. The refractive index nt and the thickness d of the transparent layer are properly adjusted so as to obtain desired optical characteristics.

For example, there is provided a transparent layer having a refractive index nt which is higher than the refractive index no of the substrate and less than the refractive index nx of the channel layer. In this example, a difference in the refractive index between the layers is decreased to improve the transmittance.

In addition, interfaces, which cause discontinuity in the refractive index, are eliminated by continuously or stepwise changing the refractive index of the transparent layer in the film thickness direction or by continuously changing the refractive index of the channel layer. Thus, the transparency can be improved.

Figure 2A:
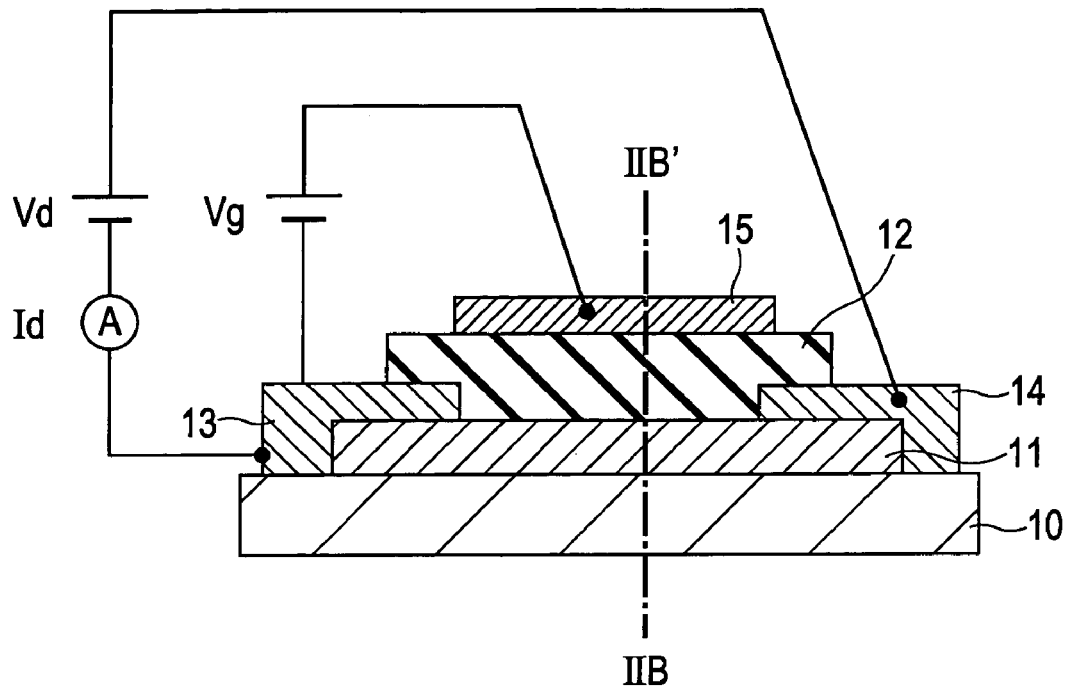
FIGS. 2A and 2B are diagrams showing a structure of a thin-film transistor according to the present invention.
Figure 2B:
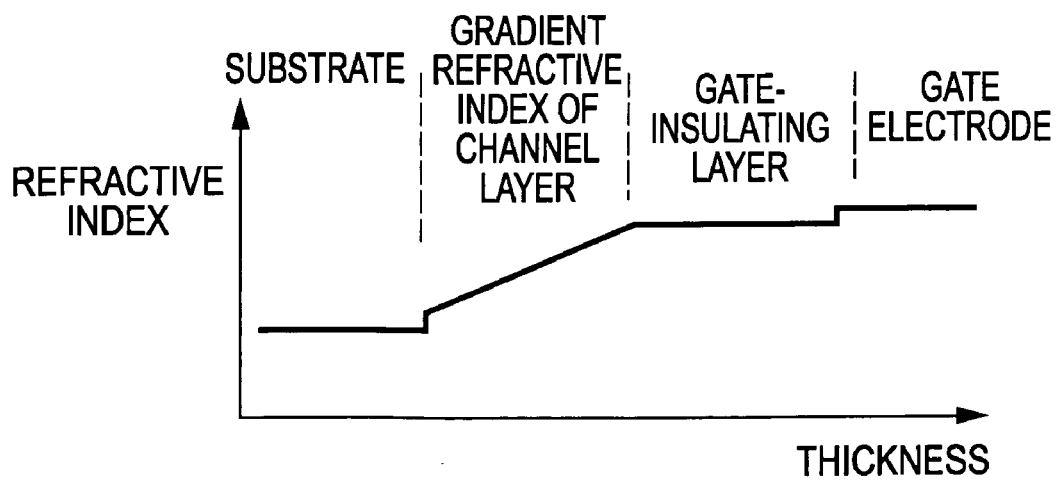

FIGS. 2A and 2B are diagrams showing a structure of other thin-film transistor according to the present invention. FIG. 2A is a cross-sectional view showing the layer structure and FIG. 2B is a graph showing a change in the refractive index in the direction of a section taken along the line IIB-IIB' in FIG. 2A.

In this example, the channel layer has a gradient in the refractive index, namely, the refractive index of the channel layer continuously changes. The thin-film transistor in this example includes a substrate, a channel layer disposed on the substrate, and a gate-insulating layer disposed on the channel layer. The refractive indices of the substrate, the channel layer, and the gate-insulating layer are no, nx, and ni, respectively, and the refractive index nx of the channel layer changes continuously or stepwise from no to ni in the film thickness direction.

In such a case, a transparent layer may not be provided as in the example shown in FIGS. 2A and 2B or may be provided on the bottom of the channel layer.

In addition, the reflection can be further decreased by properly adjusting the thickness of the transparent layer so that the light rays reflected from the top and bottom faces of the layer interfere with each other. For example, when the refractive index of the transparent layer is nt and the wavelength of light is λ, the thickness d of the layer may be adjusted to be defined by the following equation:

$$d=\lambda/(4 \times nt).$$

However, the thickness is not limited to this and may be properly adjusted to obtain desired optical characteristics.

It is well known that the light transmittance of optical components can be improved by forming a dielectric film on a transparent substrate. However, in characteristic devices, i.e., in transparent thin-film transistors, it has not been known that a specific constitution satisfies both the device characteristics (characteristics as electronic devices) and optical characteristics (transmittance).

In the thin-film transistor of the present invention, the oxide thin-film members (transparent layer, channel layer, electrode layer, and gate-insulating layer) can be formed as amorphous thin films. In a polycrystal, when the crystal size is one-severalth of the wavelength of light, light scattering from the transparency occurs. Therefore, it is preferred in the present invention that the thin-film members are amorphous. When the thin-film members are polycrystalline, it is preferred that the crystal size is 50 nm or less. With this, thin-film transistors having high transparency can be achieved.

FIG. 1 shows an example of a top-gate structure fabricated by sequentially forming a gate-insulating layer 12 and a gate-electrode 15 on a semiconductor channel layer 11. As another example, a bottom-gate structure can be fabricated.

Figure 3:
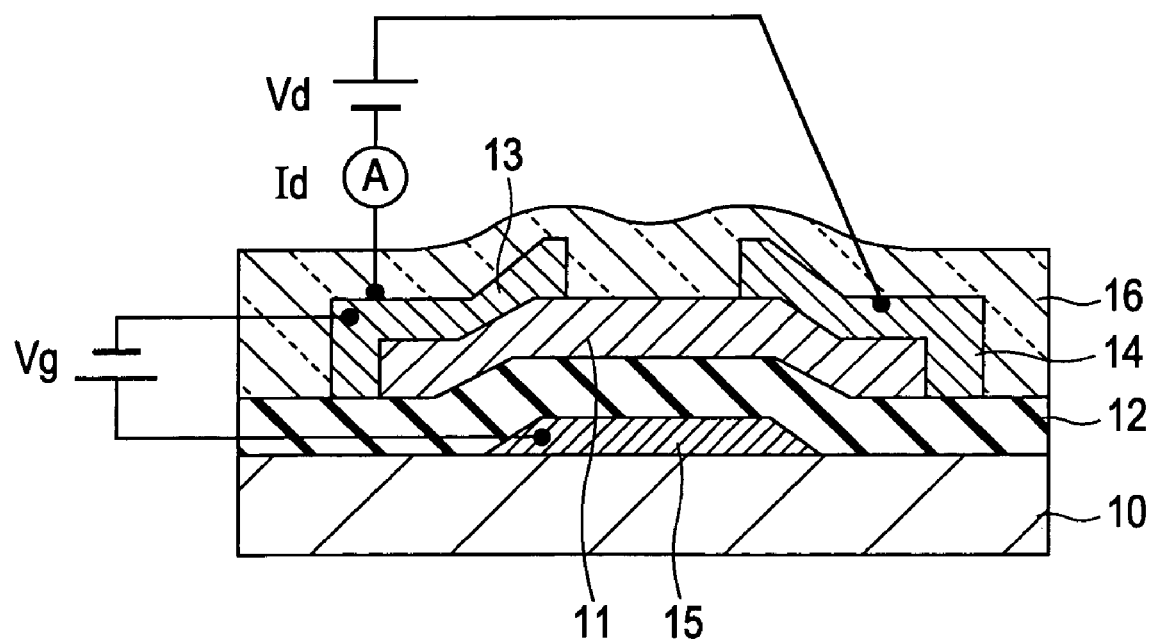
FIG. 3 is a cross-sectional view of a structure of a thin-film transistor according to the present invention.

FIG. 3 is a cross-sectional view of a thin-film transistor with another structure (bottom-gate structure) according to the present invention.

The thin-film transistor is an example of a bottom-gate structure fabricated by sequentially forming a gate-insulating layer 12 and a semiconductor channel layer 11 on a gate electrode 15. The structures shown in FIG. 1 and FIG. 3 are called a staggered structure and an inverted-staggered structure, respectively.

In the structure shown in FIG. 3, a transparent layer 16 disposed on the channel layer functions to prevent the reflection of incident light from the surface. Thus, a TFT with more excellent transparency can be obtained.

The TFTs of the present invention are not limited to the above-mentioned structures. The top or bottom-gated structure or the staggered or inverted-staggered structure can be optionally used.

Materials for each layer will now be described.

The channel layer may be formed of an oxide such as ZnO or $SnO_2$; however, the materials shown below can provide excellent characteristics to the transistor. In other words, the channel layer can be formed of an amorphous oxide having a composition represented by the following formula:

$$[(Sn_{1-x}M4_x)O_2]a.[(In_{1-y}M3_y)_2O_3]b.[(Zn_{1-z}M2_z)O]c$$

wherein $0 \leq x \leq 1$, $0 \leq y \leq 1$, $0 \leq z \leq 1$;
$0 \leq a \leq 1$, $0 \leq b \leq 1$, $0 \leq c \leq 1$;
$a+b+c=1$;

M4 is a Group 4 element (Si, Ge, or Zr) having an atomic number less than that of Sn;

M3 is a Group 3 element (B, Al, Ga, or Y) having an atomic number less than that of In, or Lu; and M2 is a Group 2 element (Mg or Ca) having an atomic number less than that of Zn.

In particular, amorphous materials represented by the following formula are preferable:

$$[(In_{1-y}Ga_y)_2O_3]b.[(ZnO)]c,$$

wherein $0 \leq y \leq 1$, $0 \leq b \leq 1$, and $0 \leq c \leq 1$; and $$[SnO_2]a.[In_2O_3]b.[ZnO]c,$$

wherein $0 \leq a \leq 1$, $0 \leq b \leq 1$, and $0 \leq c \leq 1$.

For example, an amorphous oxide film applied as the channel layer can be achieved by using a single, binary, or ternary system composition which resides in a triangle defined by $SnO_2$; $In_2O_3$, and ZnO at the vertices. In a certain range of the composition ratio of the ternary system composition, the oxide may be crystallized. For example, in the binary system composition containing two of the three compounds, an amorphous film can be formed when the composition contains In at about 80 atomic % or more in an In—Zn—O system or when the composition contains In at about 80 atomic % or more in a Sn—In—O system.

The transparent layer may be formed of a proper dielectric oxide, however, the materials shown below are preferred because they are amorphous and have high controllability in the refractive index. In other words, the transparent layer may be formed of an amorphous oxide having a composition represented by the following formula:

$$[(Sn_{1-x}M4_x)O_2]a.[(In_{1-y}M3_y)_2O_3]b.[(Zn_{1-z}M2_z)O]c$$

wherein $0 \leq x \leq 1$, $0 \leq y \leq 1$, $0 \leq z \leq 1$;
$0 \leq a \leq 1$, $0 \leq b \leq 1$, $0 \leq c \leq 1$;
$a+b+c=1$;

M4 is a Group 4 element (Si, Ge, or Zr) having an atomic number less than that of Sn;

M3 is a Group 3 element (B, Al, Ga, or Y) having an atomic number less than that of In, or Lu; and M2 is a Group 2 element (Mg or Ca) having an atomic number less than that of Zn.

In particular, amorphous materials represented by the following formula are preferable:

$$[(In_{1-y}Ga_y)_2O_3]b.[(ZnO)]c,$$

wherein $0 \leq y \leq 1$, $0 \leq b \leq 1$, and $0 \leq c \leq 1$; and $$[SnO_2]a.[In_2O_3]b.[ZnO]c,$$

wherein $0 \leq a \leq 1$, $0 \leq b \leq 1$, and $0 \leq c \leq 1$.

The transparent layer may be formed of the same material as that of the channel layer. Such a case is advantageous because that both the layers can be fabricated by using the same manufacturing apparatus and can be sequentially formed. In addition, since the interface between the transparent layer and the channel layer can be formed in a stable structure, the peeling of the layers does not easily occur. Thus, the reliability can be increased.

In particular, by forming both the channel layer and the transparent layer with the above-mentioned material system, the electrical characteristics and the optical characteristics, i.e., transmittance of the thin-film transistor, can be simultaneously improved.

Figure 4A:
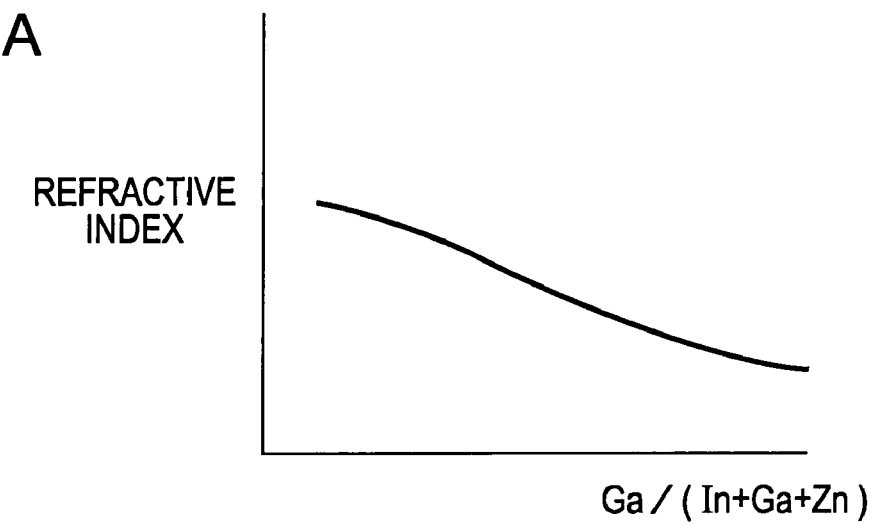
FIGS. 4A, 4B, and 4C are graphs each showing a relationship between the material composition and the refractive index.
Figure 4B:
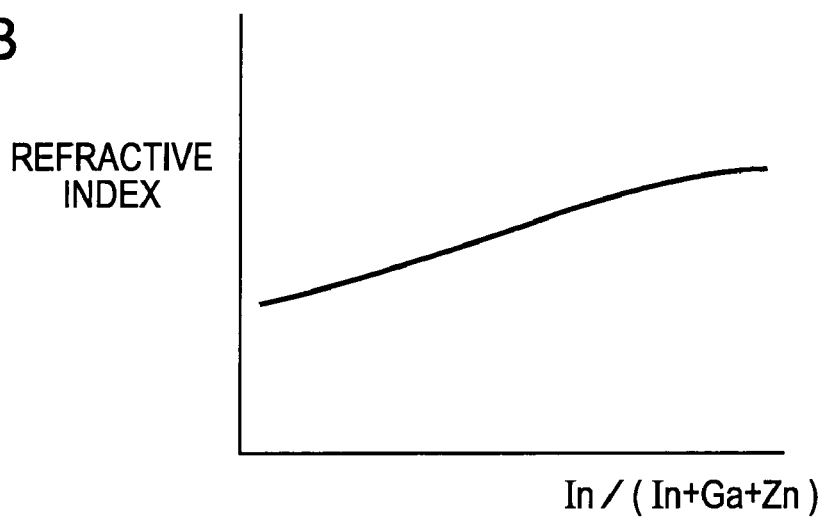
Figure 4C:
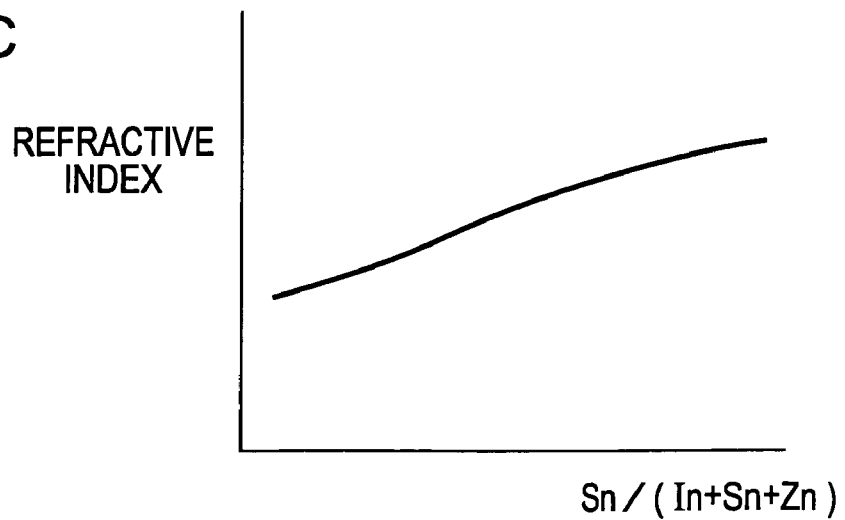

FIGS. 4A, 4B, and 4C are graphs each showing a relationship between the material composition and the refractive index.

The refractive index of the transparent layer (or channel layer) formed of an oxide shown by the above-mentioned formula can be properly adjusted by controlling the material composition. As shown in FIG. 4A, for example, in the InGaZn ternary system oxide, the refractive index can be decreased by increasing the composition ratio of Ga. Further, as shown in FIG. 4B, the refractive index can be increased by increasing the composition ratio of In. In addition, as shown in FIG. 4C, in the InSnZn ternary system oxide, the refractive index can be increased by increasing the composition ratio of Sn.

Furthermore, the refractive index can be properly adjusted by controlling the oxygen deficit in the thin film with the oxygen partial pressure during the film-forming process.

Figure 5:
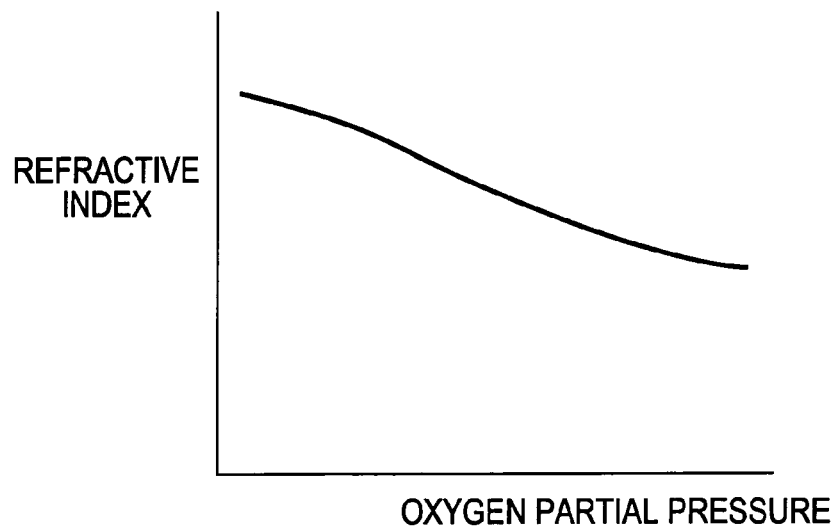
FIG. 5 is a graph showing a relationship between the oxygen partial pressure during the film-forming process and the refractive index.

FIG. 5 is a graph showing a relationship between the oxygen partial pressure during the film-forming process and the refractive index.

As shown in FIG. 5, the refractive index can be decreased by increasing the oxygen partial pressure during the film-forming process.

Thus, since an amorphous transparent layer having a desired refractive index can be obtained by properly adjusting the composition of the InGaZnO and InSnZnO systems, excellent transparent and channel layers can be provided.

The amorphous oxide layer may be formed by vapor deposition such as sputtering (SP), pulse-laser deposition (PLD), or electron-beam deposition. In particular, the sputtering is suitable because of its mass productivity. However, the film-forming process is not limited to these techniques. The film-forming process can be performed by using a substrate at about room temperature without heating the substrate.

In the transistor of the present invention, any material can be used for the gate-insulating layer 12 as long as the material has a good insulation and transparency. For example, the gate-insulating layer 12 may be formed of $Al_2O_3$, $Y_2O_3$, $SiO_2$, $HfO_2$, or a mixed crystal compound containing at least two of them. As mentioned above, the transmittance of the layer can be improved by using an amorphous material. The leakage currents between the source and gate electrodes and between the drain and gate electrodes can be controlled to about $10^{-7}$ A by using an amorphous material for the layer.

The source electrode 13, the drain electrode 14, and the gate electrode 15 may be formed of a transparent conductive film of $In_2O_3$:Sn, ZnO, or InZnO. As mentioned above, the transmittance of the electrodes can be improved by using amorphous materials.

The substrate 10 may be formed of a transparent material. Examples of the material include glass substrates, plastic substrates, and plastic films.

The amorphous thin-film transistors in accordance with the present invention can be applied as switching devices of liquid crystal displays (LCDs) and organic electroluminescence (EL) displays, and can be widely applied to not only flexible displays and also optical see-through displays, IC cards, and ID tags.

EXAMPLES

Example 1

In EXAMPLE 1, a top-gate TFT shown in FIG. 1 is fabricated.

A transparent layer 16 of an amorphous oxide film is formed on a glass substrate having a refractive index of about 1.5.

In this EXAMPLE, an amorphous oxide film of the InGaZnO system is formed by high-frequency sputtering in an atmosphere of a mixture of argon and oxygen.

The InGaZnO system amorphous oxide film is formed by simultaneously sputtering three targets (2 inches in diameter) of $In_2O_3$, $Ga_2O_3$, and ZnO at radio-frequency (RF) powers of 15 W, 200 W, and 25 W, respectively. The atmosphere during the film-forming process has a total pressure of 0.4 Pa. The gas flow ratio of Ar and $O_2$ is 100:2. The temperature of the substrate is 25° C.

The resulting thin film is evaluated by spectroscopic ellipsometry to confirm that the thickness is 75 nm and the refractive index at a wavelength of 550 nm is about 1.9. The thin film is confirmed to be insulative by the evaluation of the resistivity of the film.

The composition of the thin film by fluorescence X-ray analysis is In:Ga:Zn=1:7:1.

Then, a channel layer of an amorphous film is formed. An InGaZnO system amorphous oxide film is formed by simultaneously sputtering three targets (2 inches in diameter) of $In_2O_3$, $Ga_2O_3$, and ZnO at RF powers of 30 W, 60 W, and 50 W, respectively. The atmosphere during the film-forming process has a total pressure of 0.4 Pa. The gas flow ratio of Ar and $O_2$ is 100:1. The temperature of the substrate is 25° C. The resulting thin film is evaluated by spectroscopic ellipsometry to confirm that the thickness is 70 nm and the refractive index at a wavelength of 550 nm is about 2.0. The thin film is confirmed to be semiinsulative of a resistivity of about 50 Ωcm by the evaluation of the resistivity of the film.

The composition of the thin film by fluorescence X-ray analysis is In:Ga:Zn=1.05:1:0.95.

The resulting film is evaluated by X-ray diffraction analysis with a very small angle of incidence to the film surface (thin-film method, an incident angle of 0.55 degrees). No clear diffraction peak is observed. The resulting InGaZnO system film is confirmed to be amorphous.

A drain electrode 14 and a source electrode 13 are patterned by photolithography and lift-off. Each of the electrodes is formed of a mixture of $In_2O_3$ and ZnO (40%) and has a thickness of 60 nm.

Then, a gate-insulating layer 12 is patterned by photolithography and lift-off. An $Al_2O_3$ film is formed by electron-beam deposition as the gate-insulating film 12. The thickness of the film is 150 nm. The $Al_2O_3$ film has a relative dielectric constant of about 8 and a refractive index of about 1.6.

Then, a gate electrode 15 is patterned by photolithography and lift-off. The channel length is 50 μm and the channel width is 200 μm. The electrode is formed of a mixture of $In_2O_3$ and ZnO (40%) and has a thickness of 50 nm.

Comparative Example 1

As a comparative sample, a TFT not having a transparent layer is fabricated by the same method as above.

Evaluation of Characteristics of TFT

Figure 6A:
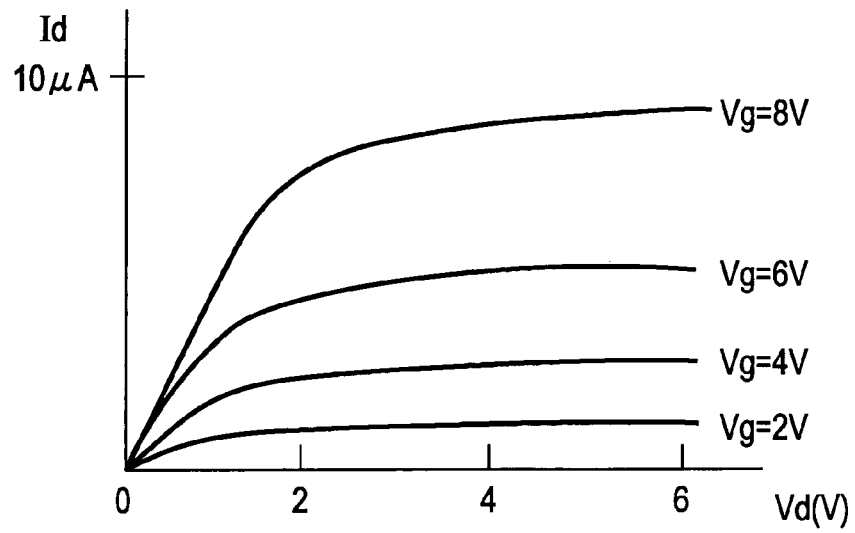
FIGS. 6A and 6B are graphs showing characteristics of a thin-film transistor according to the present invention.
Figure 6B:
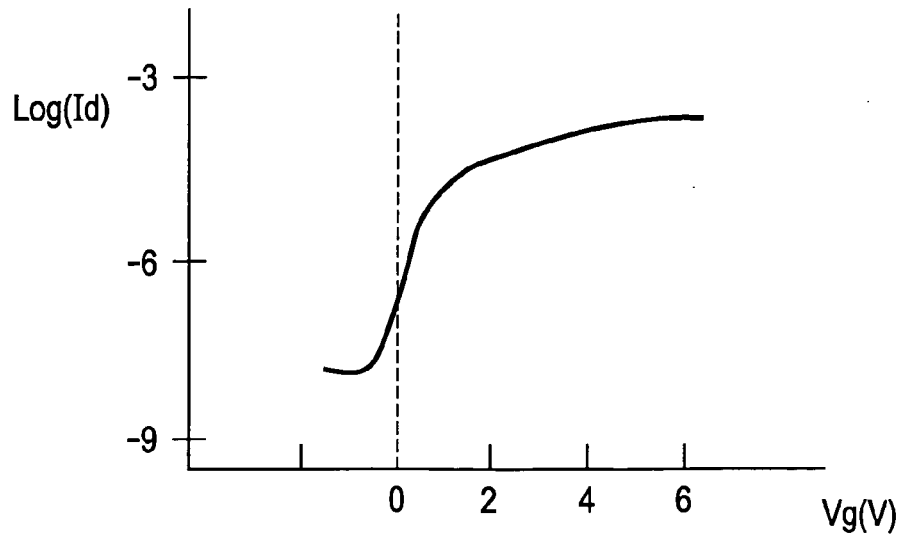

FIGS. 6A and 6B are graphs showing exemplary characteristics of a thin-film transistor according to the present invention.

When a voltage Vd of about 5 V is applied between the source and drain electrodes, the current Id between the source and drain electrodes can be controlled (switched ON/OFF) by switching ON/OFF an applied gate voltage Vg between 0 V and 5 V. FIG. 6A shows Id-Vd characteristics plotted for various values of Vg, and FIG. 6B shows Id-Vg characteristics (transfer characteristics) when Vd is 6 V.

As shown in FIG. 6A, the current Id between source and drain electrodes is measured by changing the drain voltage Vd while maintaining the gate voltage Vg constant. Behavior as a typical semiconductor transistor is observed, namely, a drain voltage Vd of about 6 V is the saturation pressure (pinch-off). Gain profiles are investigated to confirm that the threshold value of the gate voltage Vg is about –0.5 V when the applied drain voltage Vd is 4 V. In addition, the current Id between the source and drain electrodes is about $1.0 \times 10^{-5}$ A when the gate voltage is 10 V.

The ON/OFF ratio of the transistor exceeded $10^6$. The field-effect mobility calculated from the output characteristics is about 6.5 $cm^2 (Vs)^{-1}$ in the saturation region. When the same measurement is performed for the resulting device while irradiating with visible light, the characteristics of the transistor do not change.

There is not observed a substantial difference in electrical characteristics between the TFT of the EXAMPLE 1 and the TFT of the COMPARATIVE EXAMPLE 1 as far as the transistor characteristics are compared.

On the other hand, the transmittance of the TFT of the EXAMPLE 1 is superior to that of the TFT of the COMPARATIVE EXAMPLE 1 over the entire visible light region.

Figure 7:
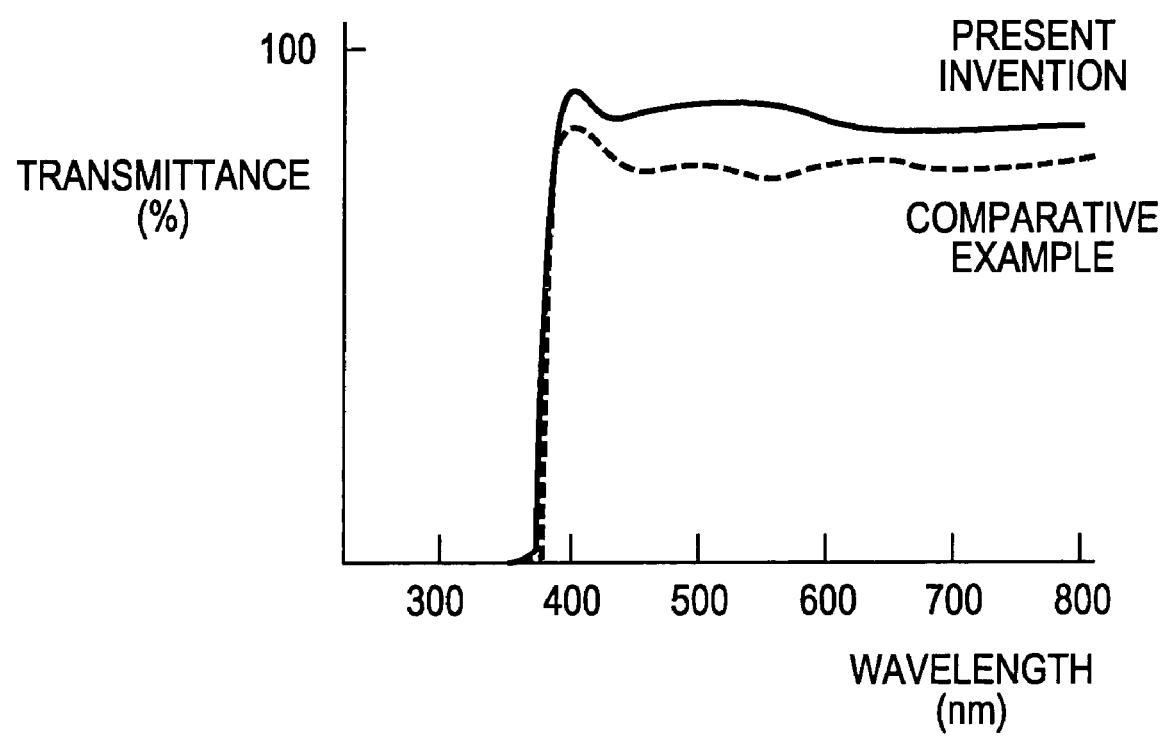
FIG. 7 is a graph showing transmittance characteristics of a thin-film transistor according to the present invention.

FIG. 7 is a graph showing transmittance characteristics of a thin-film transistor according to the present invention.

In FIG. 7, the solid line shows the transmittance of the TFT of the EXAMPLE 1 and the dotted line shows the transmittance of the TFT of the COMPARATIVE EXAMPLE 1.

The thin-film transistor of the present invention has excellent transparency and is expected to be applied to an operating circuit of an organic light-emitting diode.

Example 2

In EXAMPLE 2, a top-gate TFT shown in FIGS. 2A and 2B is fabricated on a plastic substrate. In the device of this EXAMPLE, the channel layer is a film having a gradient refractive index.

Firstly, a channel layer of an amorphous oxide film is formed on a polyethylene terephthalate (PET) film having a refractive index of about 1.5.

In this EXAMPLE, the amorphous oxide film of the InGaZnO system is formed by high-frequency sputtering in an atmosphere of a mixture of argon and oxygen.

The InGaZnO system amorphous oxide film is formed by simultaneously sputtering three targets (2 inches in diameter) of $In_2O_3$, $Ga_2O_3$, and ZnO.

The RF powers applied to the targets, $In_2O_3$, $Ga_2O_3$, and ZnO, are 0 W, 200 W, and 0 W, respectively, when the film-forming starts. Then, the RF powers applied to the $In_2O_3$ and ZnO are increased and the RF power applied to the $Ga_2O_3$ is decreased. Finally, all the RF powers applied to the $In_2O_3$, $Ga_2O_3$, and ZnO are 40 W. The atmosphere during the film-forming process has a total pressure of 0.4 Pa. The gas flow ratio of Ar and $O_2$ is 100:1.5. The temperature of the substrate is 25° C.

As a result, as shown in FIG. 2B, the refractive index of the channel layer is gradually and continuously increased from the substrate side toward the surface. That is, the channel layer is formed as a gradient-refractive-index film the refractive index of which is continuously changed in the film thickness direction. The refractive index is estimated about 1.7 near the substrate and about 2.1 at the surface. The total thickness of the channel layer is 110 nm.

The resulting film is evaluated by X-ray diffraction analysis with a very small angle of incidence to the film surface (thin-film method, an incident angle of 0.5 degrees). No clear diffraction peak is observed. The resulting InGaZnO system film is confirmed to be amorphous.

A drain electrode 14 and a source electrode 13 are patterned by photolithography and lift-off. Each of the electrodes is formed of a mixture of $In_2O_3$ and ZnO (40%) and has a thickness of 60 nm.

Then, a gate-insulating layer 12 is patterned by photolithography and lift-off. A $Y_2O_3$ film is formed by electron-beam deposition as the gate-insulating film 12. The thickness of the film is 150 nm. The $Y_2O_3$ film has a relative dielectric constant of about 12 and a refractive index of about 2.

Comparative Example 2

As a comparative sample, a thin-film transistor having the same structure as that in COMPARATIVE EXAMPLE 1 is fabricated on a PET substrate.

Evaluation of Characteristics of TFT

The ON/OFF ratio of the transistor of the EXAMPLE 2 exceeds $10^3$. The field-effect mobility calculated from the output characteristics is about 5 $cm^2$ $(Vs)^{-1}$ in the saturation region. The transistor characteristics of the TFT of the EXAMPLE 2 are equivalent to those of the TFT of the COMPARATIVE EXAMPLE 2, but the transmittance of the TFT of the EXAMPLE 2 is superior to that of the TFT of the COMPARATIVE EXAMPLE 2.

The TFT fabricated on the PET film is bent at a radius of curvature of 30 mm and the transistor characteristics of the TFT are measured. There are not observed substantial changes in the transistor characteristics. The thin-film transistor fabricated on a flexible substrate in the EXAMPLE 2 has excellent transparency and is expected to be applied to an operating circuit of an organic light-emitting diode.

Example 3

Figure 8:
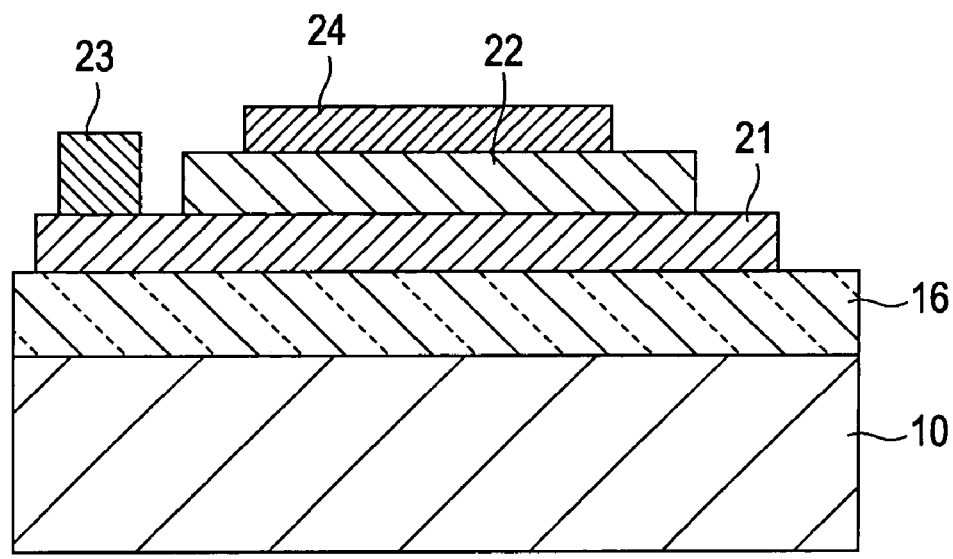
FIG. 8 is a cross-sectional view showing a structure of a thin-film diode according to the present invention.

FIG. 8 is a cross-sectional view showing a structure of a thin-film diode in EXAMPLE 3 according to the present invention.

In EXAMPLE 3, as an oxide semiconductor device, a PN-junction device (thin-film diode) having a structure shown in FIG. 8 is fabricated.

Firstly, a transparent layer 16 of an InGaZnO system amorphous oxide film is formed on a glass substrate 10 having a refractive index of about 1.5. In this EXAMPLE, the film is formed by sputtering an $In_2O_3.Ga_2O_3.ZnO$ oxide composite target. The atmosphere during the film-forming process has a total pressure of 0.4 Pa. The gas flow ratio of Ar and $O_2$ is 100:10. The temperature of the substrate is 25° C.

The resulting thin film is evaluated by spectroscopic ellipsometry to confirm that the thickness is 75 nm and the refractive index at a wavelength of 550 nm is about 1.9.

The composition of the thin film by fluorescence X-ray analysis is In:Ga:Zn=1:1:0.9.

Then, an n-type semiconductor layer 21 of an InSnZnO system amorphous oxide film is formed by the same method as above. The film is formed by sputtering an $In_2O_3.2SnO_3.2ZnO$ oxide composite target. The atmosphere during the film-forming process has a total pressure of 0.4 Pa. The gas flow ratio of Ar and $O_2$ is 100:2. The temperature of the substrate is 25° C.

The resulting thin film is evaluated by spectroscopic ellipsometry to confirm that the thickness is 60 nm and the refractive index at a wavelength of 550 nm is about 2.2.

The composition of the thin film by fluorescence X-ray analysis is In:Sn:Zn=1:1.1:0.9.

Then, a p-type semiconductor layer 22 of a ZnRhO system amorphous oxide film is formed by patterning. The film is formed by sputtering a $Rh_2O_3.2ZnO$ oxide composite target. The atmosphere during the film-forming process has a total pressure of 0.4 Pa. The gas flow ratio of Ar and $O_2$ is 10:1.

Lastly, an n-side electrode 23 and a p-side electrode 24 are formed by patterning. Each of the electrodes is formed of a mixture of $In_2O_3$ and ZnO (40%) and has a thickness of 60 nm.

The current-voltage characteristics between the n-side electrode and the p-side electrode are evaluated to observe that the thin-film diode of EXAMPLE 3 has diode characteristics.

It is observed that the transmittance of the diode is improved compared with that of a diode which does not have the transparent layer but has the same structure as the above-mentioned structure other than the transparent layer.

The PN-junction diode according to EXAMPLE 3 has excellent transparency and is expected to be applied to a transparent electronic circuit.

Since the transparent amorphous thin-film transistors in accordance with the present invention are transparent to visible and infrared light having a wavelength of 400 nm or more, they can be applied as switching devices of LCDs and organic EL displays. In addition, the thin-film transistors can be widely applied to not only flexible displays and also optical see-through displays, IC cards, and ID tags.

In addition, since the thin films in accordance with the present invention can be formed at a low temperature and are in an amorphous state, they can be formed on flexible materials such as PET films.

As many apparently widely different embodiments of the present invention can be made without departing from the spirit and scope thereof, it is to be understood that the invention is not limited to the specific embodiments thereof except as defined in the claims.

This application claims priority from Japanese Patent application No. 2005-258272 filed on Sep. 6, 2005, the entire contents of which are hereby incorporated by reference herein.

What is claimed is:

1. A thin-film transistor comprising:
   a channel layer being formed of an oxide semiconductor transparent to visible light, the channel layer having a refractive index of nx;
   a gate-insulating layer disposed on one face of the channel layer; and
   a transparent layer disposed on the other face of the channel layer and having a refractive index of nt,
   wherein there is a relationship of nx>nt.

2. The thin-film transistor according to claim 1, further comprising:
   a substrate disposed on the transparent layer on the side opposite the channel layer and having a refractive index of no,
   wherein there is a relationship of nx>nt>no.

3. The thin-film transistor according to claim 1, wherein the refractive index nx of the channel layer or the refractive index nt of the transparent layer changes continuously or stepwise in the film thickness direction.

4. The thin-film transistor according to claim 1, wherein the film thickness d of the transparent layer having a refractive index of nt is defined by the following equation:

$$d=\lambda/(4\times nt)$$

wherein λ is the wavelength of light.

5. The thin-film transistor according to claim 1, wherein the transparent layer is formed of an amorphous oxide having a composition represented by the following formula:

$$[(Sn_1-xM4_x)O_2]a.[(In_1-yM3_y)_2O_3]b.[(Zn_1-zM2_zO)]c$$

wherein 0≦x≦1, 0≦y≦1, 0≦z≦1, 0≦a≦1, 0≦b≦1, 0≦c≦1, and a+b+c=1;
   M4 is a Group 4 element having an atomic number less than that of Sn selected from the group consisting of Si, Ge, and Zr;
   M3 is Lu or a Group 3 element having an atomic number less than that of In selected from the group consisting of B, Al, Ga, and Y; and
   M2 is a Group 2 element having an atomic number less than that of Zn selected from the group consisting of Mg and Ca.

6. The thin-film transistor according to claim 1, wherein the channel layer is formed of an amorphous oxide having a composition represented by the following formula:

$$[(Sn_1-xM4_x)O_2]a.[(In_1-yM3_y)_2O_3]b.[(Zn_1-zM2_zO)]c$$

wherein 0≦x≦1, 0≦y≦1, 0≦z≦1, 0≦a≦1, 0≦b≦1, 0≦c≦1, and a+b+c=1;
   M4 is a Group 4 element having an atomic number less than that of Sn selected from the group consisting of Si, Ge, and Zr;
   M3 is Lu or a Group 3 element having an atomic number less than that of In selected from the group consisting of B, Al, Ga, and Y; and
   M2 is a Group 2 element having an atomic number less than that of Zn selected from the group consisting of Mg and Ca.

7. The thin-film transistor according to claim 6, wherein M3 is Ga.

8. The thin-film transistor according to claim 7, wherein the amorphous oxide has a composition represented by the following formula:

$$[(In_1-yGa_y)_2O_3]b.[(ZnO)]c.$$

9. The thin-film transistor according to claim 6, wherein the amorphous oxide has a composition represented by the following formula:

$$[SnO_2]a.[InO_3]b.[ZnO]c.$$

10. The thin-film transistor according to claim 1, wherein the channel layer and the transparent layer are each formed of an amorphous oxide having a composition represented by the following formula:

$$[(Sn_1-xM4_x)O_2]a.[(In_1-yM3_y)_2O_3]b.[(Zn_1-zM2_zO)]c$$

wherein 0≦x≦1, 0≦y≦1, 0≦z≦1, 0≦a≦1, 0≦b≦1, 0≦c≦1, and a+b+c=1;
   M4 is a Group 4 element having an atomic number less than that of Sn selected from the group consisting of Si, Ge, and Zr;
   M3 is Lu or a Group 3 element having an atomic number less than that of In selected from the group consisting of B, Al, Ga, and Y; and
   M2 is a Group 2 element having an atomic number less than that of Zn selected from the group consisting of Mg and Ca.

11. A thin-film transistor comprising:
    a substrate having a refractive index of no;
    a channel layer disposed on the substrate, the channel layer being formed of an oxide semiconductor transparent to visible light, and the channel layer having a refractive index of nx; and
    a gate-insulating layer disposed on the channel layer and having a refractive index of ni,
    wherein the refractive index nx of the channel layer changes continuously or stepwise from no to ni in the film thickness direction.

12. The thin-film transistor according to claim 11, wherein the amorphous oxide has a composition represented by the following formula:

$$[(In_1-yGa_y)_2O_3]b.[(ZnO)]c.$$

13. A thin-film diode comprising:
    a substrate having a refractive index of no;
    a transparent layer disposed on the substrate and having a refractive index of nt; and
    an oxide semiconductor layer disposed on the transparent layer, the oxide semiconductor layer being transparent to visible light and having a refractive index of nx,
    wherein there is a relationship of nx>nt>no.

14. The thin-film diode according to claim 13, wherein the transparent layer or the oxide semiconductor layer is formed of an amorphous oxide having a composition represented by the following formula:

$$[(Sn_1-xM4_x)O_2]a.[(In_1-yM3_y)_2O_3]b.[(Zn_1-zM2_zO)]c$$

wherein 0≦x≦1, 0≦y≦1, 0≦z≦1, 0≦a≦1, 0≦b≦1, 0≦c≦1, and a+b+c=1;
   M4 is a Group 4 element having an atomic number less than that of Sn selected from the group consisting of Si, Ge, and Zr;
   M3 is Lu or a Group 3 element having an atomic number less than that of In selected from the group consisting of B, Al, Ga, and Y; and M2 is a Group 2 element having an atomic number less than that of Zn selected from the group consisting of Mg and Ca.

15. The thin-film diode according to claim 13, wherein the transparent layer and the oxide semiconductor layer are each formed of an amorphous oxide having a composition represented by the following formula:

$$[(Sn_{1-x}M4_x)O_2]a \cdot [(In_{1-y}M3_y)_2O_3]b \cdot [(Zn_{1-z}M2_zO)]c$$

wherein $0 \leq x \leq 1$, $0 \leq y \leq 1$, $0 \leq z \leq 1$, $0 \leq a \leq 1$, $0 \leq b \leq 1$, $0 \leq c \leq 1$, and $a+b+c=1$;

M4 is a Group 4 element having an atomic number less than that of Sn selected from the group consisting of Si, Ge, and Zr;

M3 is Lu or a Group 3 element having an atomic number less than that of In selected from the group consisting of B, Al, Ga, and Y; and M2 is a Group 2 element having an atomic number less than that of Zn selected from the group consisting of Mg and Ca.

* * * * *